United States Patent [19]

Yamazaki et al.

[11] 4,042,479
[45] Aug. 16, 1977

[54] THIN FILM RESISTOR AND A METHOD OF PRODUCING THE SAME

[75] Inventors: Jun'ichiro Yamazaki; Takeshi Kamo; Yoshiichi Saito, all of Kawasaki, Japan

[73] Assignee: Fujitsu Ltd., Kawasaki, Japan

[21] Appl. No.: 723,310

[22] Filed: Sept. 14, 1976

Related U.S. Application Data

[63] Continuation of Ser. No. 532,680, Dec. 13, 1974, abandoned.

[30] Foreign Application Priority Data

Dec. 27, 1973 Japan .................................. 48-1927

[51] Int. Cl.² .................. C23C 15/00; H01B 1/00; H01C 7/00
[52] U.S. Cl. ...................... 204/192 F; 252/518; 338/308; 428/539
[58] Field of Search ............... 204/192 F; 338/308; 427/101; 428/539; 252/518

[56] References Cited

U.S. PATENT DOCUMENTS

| | | | |
|---|---|---|---|
| 3,737,343 | 6/1973 | Basseches et al. | 204/192 X |
| 3,763,026 | 10/1973 | Cordes | 204/192 |

OTHER PUBLICATIONS

W. D. Westwood et al., "Tantalum Thin Films," Academic Press, N.Y., (1975), pp. 138-188, 251-269, 276-280.

*Primary Examiner*—John H. Mack
*Assistant Examiner*—Aaron Weisstuch
*Attorney, Agent, or Firm*—Staas & Halsey

[57] ABSTRACT

The present invention provides a new thin film resistor to be utilized as an electronic element, which consists of tantalum, aluminum and nitrogen. This new thin film resistor has a higher value of sheet resistance and higher stability than conventional thin film resistors. The present invention also provides a method of producing the thin film resistor by a sputtering process carried out with a target made of tantalum and aluminum in an atmosphere of argon and nitrogen thereby forming a thin film on a substrate.

3 Claims, 5 Drawing Figures

THIN FILM RESISTOR AND A METHOD OF PRODUCING THE SAME

This is a continuation, of application Ser. No. 532,680, filed Dec. 13, 1974, now abandoned.

BACKGROUND OF THE INVENTION

1. Field of the Invention

The present invention relates to a thin film resistor to be utilized as an electronic element, and a method of producing the same.

2. Description of the Prior Art

Thin film resistors of tantalum nitride (Ta—N) and of tantalum aluminum (Ta—Al) respectively have already been practically applied. In general, a thin film resistor is preferably required to have characteristics such as a high value of sheet resistance with high stability, which changes little over a lapse of time, and a low value of temperature coefficient of resistance (TCR). The sheet resistance is expressed as $\rho/d$, wherein $\rho$ is the value of specific resistivity and d is the thickness of the film. There is no way to enhance the sheet resistance of the thin film, apart from increasing the specific resistivity ($\rho$) and/or reducing the thickness of the film (d).

With respect to the tantalum nitride film, the specific resistivity may reach approximately 250$\mu\Omega$ cm, provided that the film has a composition which provides the maximum value of specific resistivity and a minimum value of thickness while exhibiting stable characteristics.

In the case of tantalum aluminum, it is possible to provide the same value of specific resistivity as that of the critical tantalum nitride film set forth above, and it is also possible to maintain the stable characteristics even if the film thickness is reduced to a half or a quarter of the value of the film thickness of the critical tantalum nitride film mentioned above. Therefore, according to the composition of tantalum and aluminum, a higher sheet resistance than that of the tantalum nitride film can be provided, since the sheet resistance is expressed as $\rho/d$. words, a thin film with the Ta—Al composition is capable of having a sheet resistance with about four times the value of sheet resistance of the thin film with the Ta—N composition.

SUMMARY OF THE INVENTION

An object of the present invention i to provide a thin film resistor of a new composition which has higher sheet resistance than that of the conventional thin film resistor of tantalum-aluminum composition and exhibits stable characteristics which change little with the lapse of time.

The object of the invention is achieved by applying a composition consisting of tantalum (Ta), aluminum (Al) and nitrogen (N). The thin film of the Ta—Al—N composition according to the present invention may, like the thin films of Ta—N composition and Ta—Al composition, be formed by the well known sputtering process.

According to the present invention, a target used in the sputtering process is made of a composition consisting of tantalum and aluminum in a predetermined ratio and a sputtering atmosphere is provided, having nitrogen gas ($N_2$) and argon (Ar) in predetermined partial pressures. Under the above conditions, a thin film of a composition consisting of Ta, Al and N is formed on a substrate of ceramic material or the like by the sputtering operation.

The present invention will hereinafter be described in more detail from the point of view of its advantages when compared with the conventional thin film resistors by way of examples, and with reference to the accompanying drawings.

DESCRIPTION OF THE INVENTION

Figure 1:
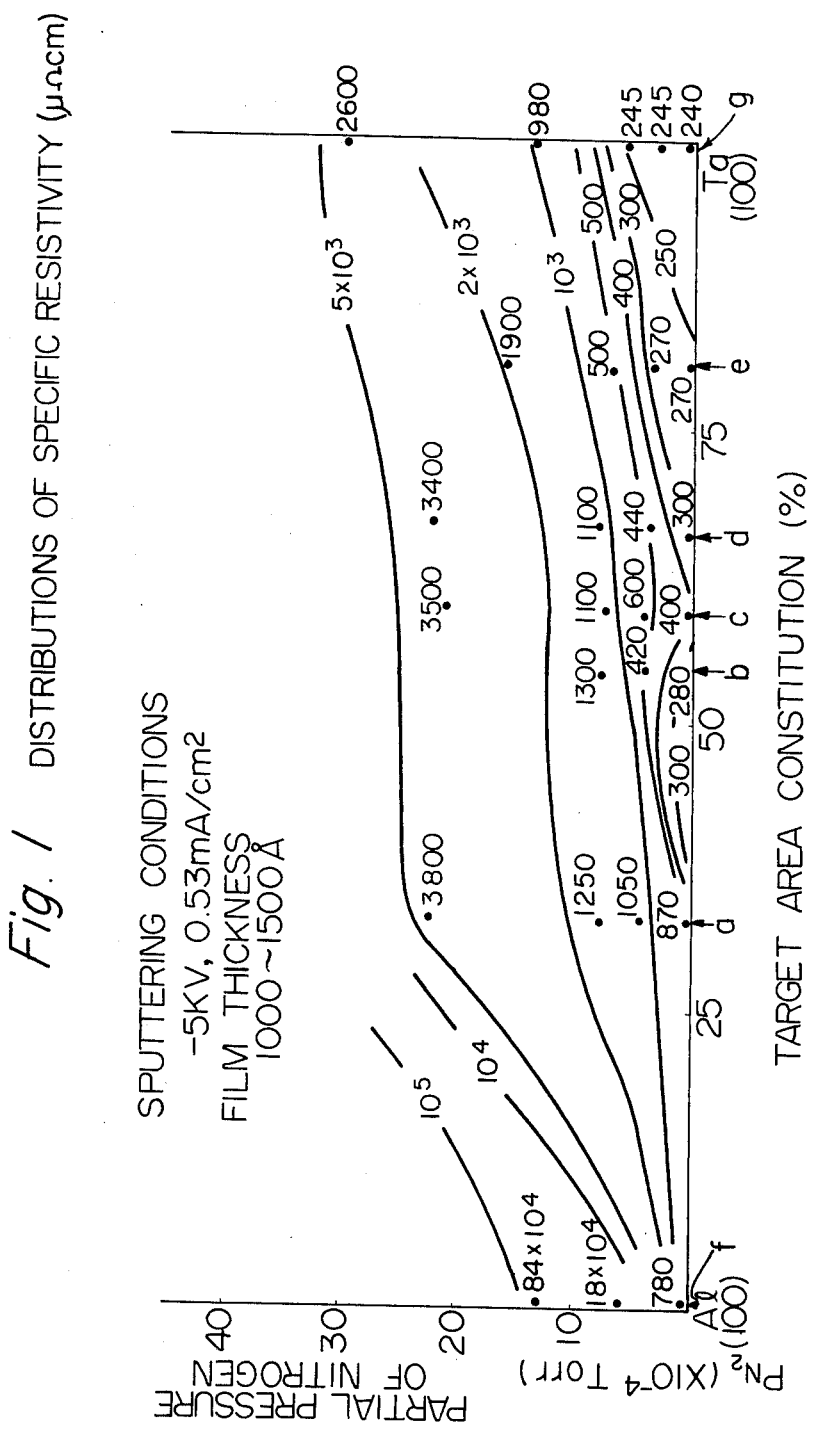
FIG. 1 is a contour line graph showing the distribution of specific resistivity ($\rho$) expressed in micro-ohm-centimeter ($\mu\Omega$cm) plotted with respect to ratios of Ta—Al composition and partial pressures of $N_2$ gas.
Figure 2:
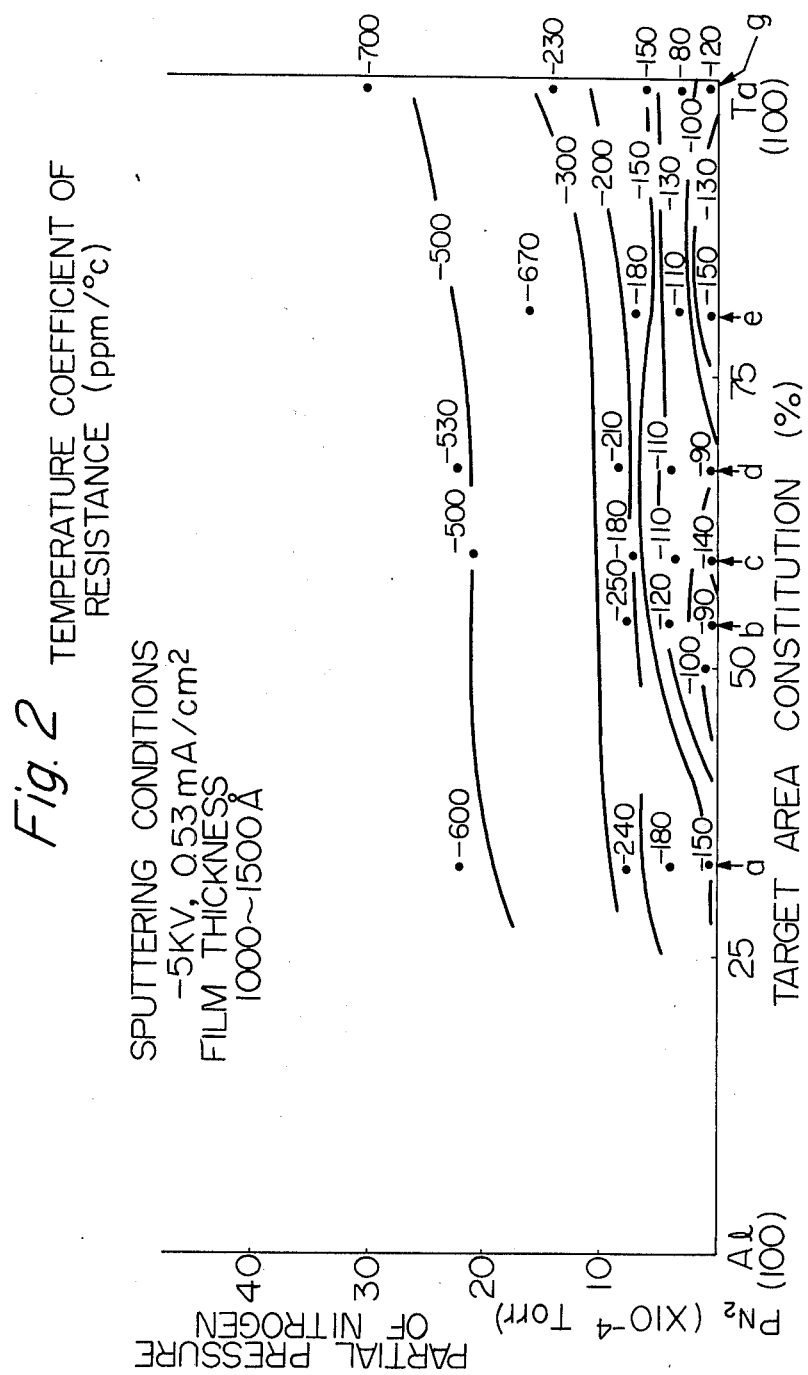
FIG. 2 is a contour line graph showing the distribution of the temperature coefficient of resistance (TCR) expressed in ppm per degree centigrade plotted with respect to the same variables shown in FIG. 1.
Figure 3:
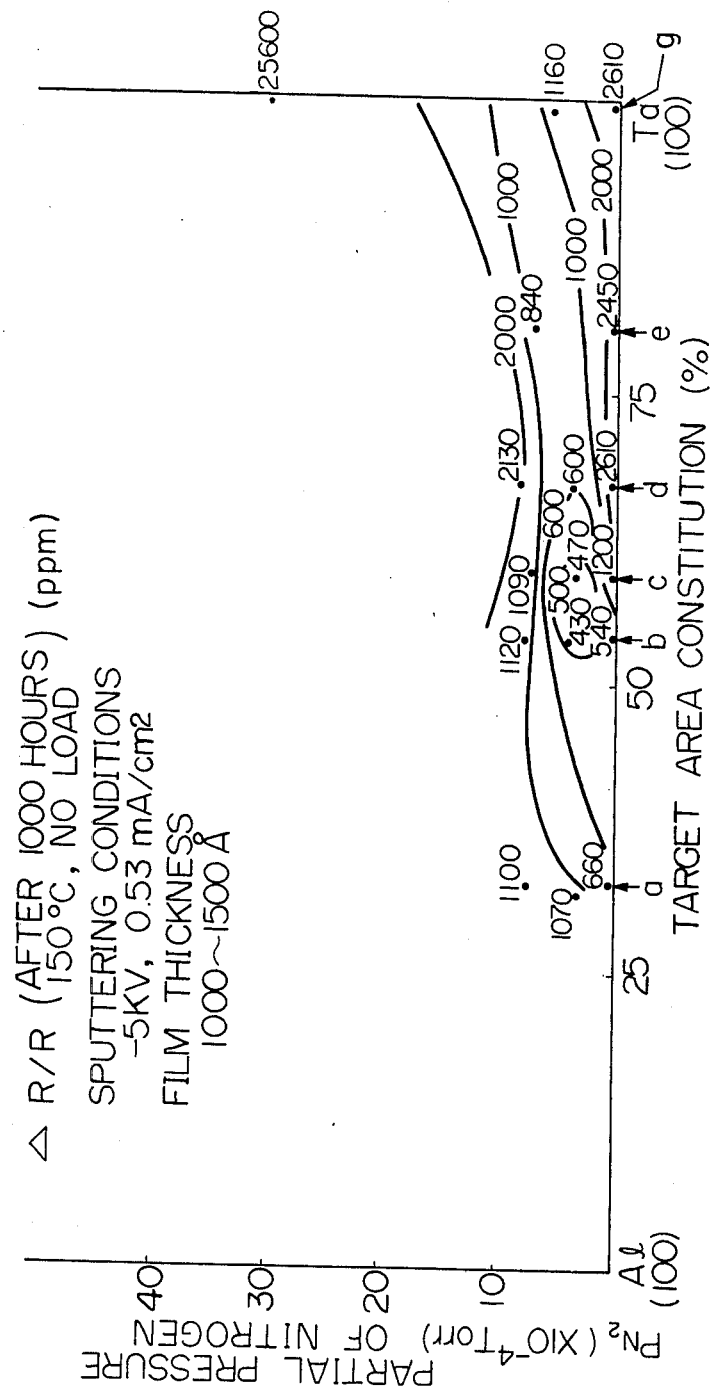
FIG. 3 is a contour line graph showing the distribution of the resistance change $\Delta R/R$ (expressed in ppm) over a period of time plotted with respect to the same variables shown in FIGS. 1 and 2.

In FIGS. 1, 2 and 3, the distributions of specific resistivity, the temperature coefficient of resistance and the resistance change with lapse of time are respectively shown in connection with the partial pressures of $N_2$ gas and the target composition of Ta-Al wherein the constituents are shown as varying from [0%–100%] to [100%–0%] respectively. The sputtering operation was carried out under sputtering conditions of −5[KV] and 0.55 [mA/cm²] to form thin films with a thickness of 300 to 1500 [A]. The above mentioned three characteristics were measured for the thin films produced by the sputtering process. The value of the resistance change with time, shown in FIG. 3, is $\Delta R/R$ ppm after 1000 hours has elapsed under a temperature of 150 [° C] with no load present.

Referring to FIGS. 1, 2 and 3, points indicated by a, b, c, d, and e show resistance characteristics of the thin film resistors, for which targets including tantalum respectively covering 34%, 54%, 60% and 80% of the target surface were used. Specific resistivity, TCR and resistance change in ageing of the thin film resistors were plotted respectively in FIGS. 1, 2 and 3. The film resistors were produced by sputtering the above-mentioned various targets in atmospheres containing nitrogen gas at various partial pressures. In FIG. 1, f shows specific resistivity of Al—N composition film resistors which were produced by sputtering targets including tantalum covering 0% of the target surfaces. At f, the targest consist of tantalum bases covered with aluminum. In FIGS. 1, 2 and 3, g shows specific resistivity, TCR and resistance change in ageing of the thin film resistors consisting of $Ta_2N$, respectively. The thin film resistors were produced by sputtering targets including tantalum occupying 100% of the target surface. In this case, the targest consist of only tantalum bases.

Figure 4:
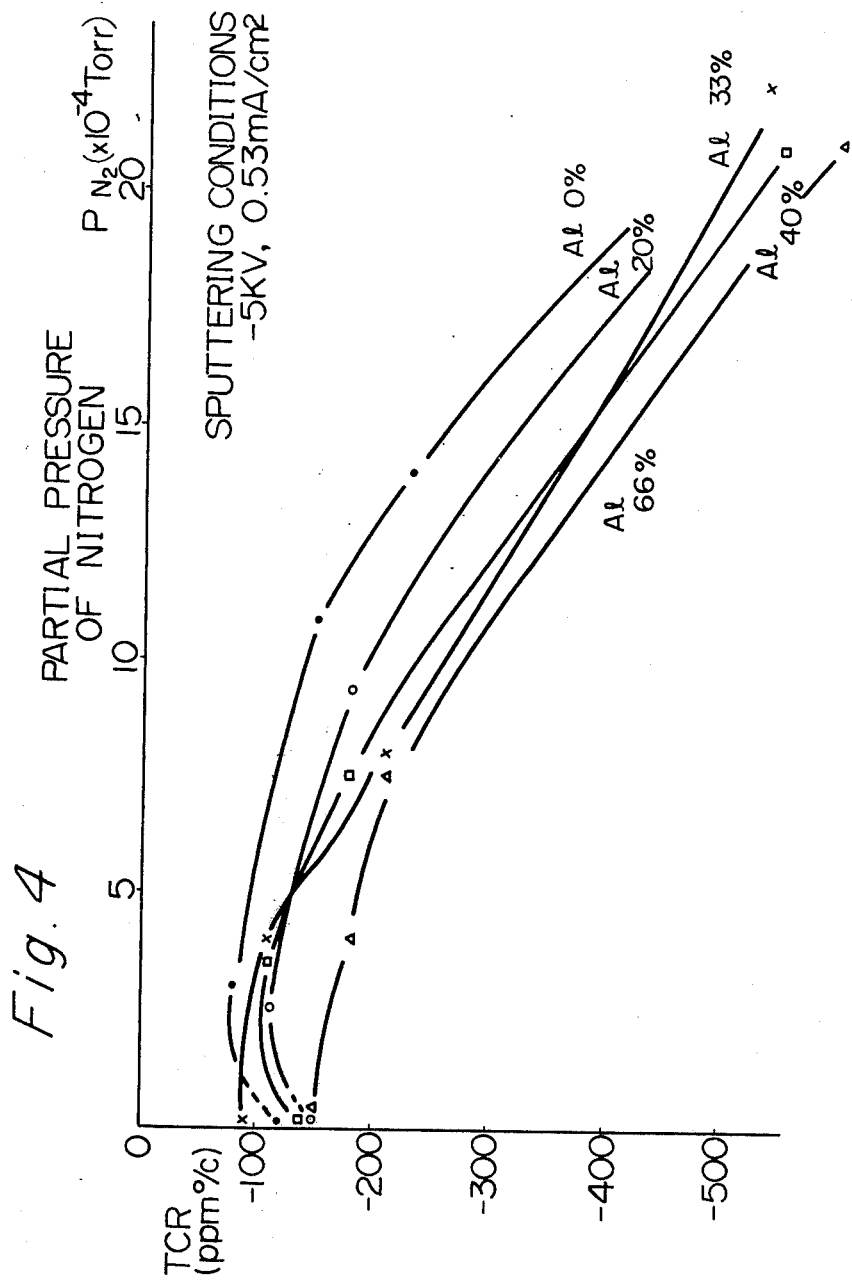
FIG. 4 is a graph showing changes of the temperature coefficient of resistance of Ta—Al—N composition film with respect to partial pressure of $N_2$ gas at various ratios of aluminum.

In FIG. 4, changes in the temperature coefficient of resistance are shown with respect to the partial pressures of $N_2$ gas at various Al ratios of Ta—Al composition targets in the above mentioned sputtering process. In this case the temperature coefficients of resistance were measured from the thin films used in FIGS. 1, 2 and 3.

Figure 5:
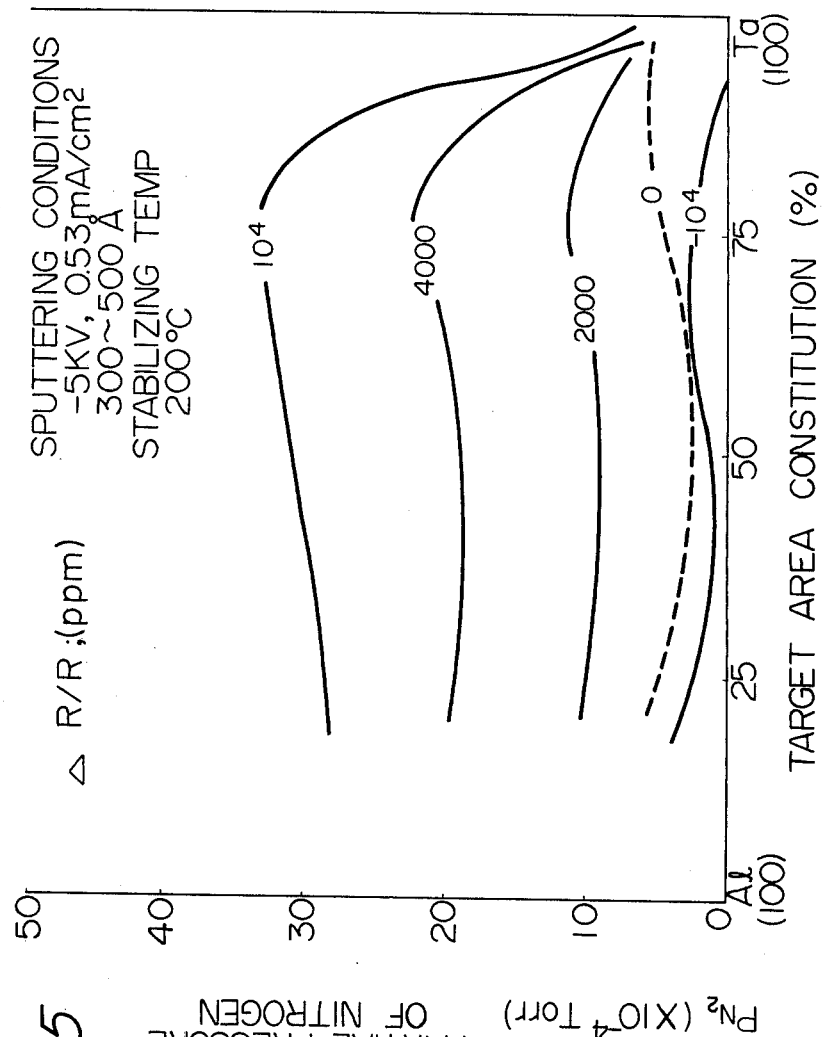
FIG. 5, is a graph showing the resistance change after aging approximately 500 ohm/sq Ta-Al-N films with 300 – 500A thickness at 150° C for 1000 hours, as functions of partial pressure of $N_2$ and aluminum %.

Referring to FIGS. 3 and 5, the thin film of Ta—Al—N composition in the region defined by the Ta—Al target composition being in a range from 30% to 80% of Tantalum, and the partial pressure of $N_2$ gas being in a range from $2 \times 10^{-4}$ to $10 \times 10^{-4}$ [Torr] has a change of temperature coefficient of resistance with a minimum value. That is, the thin film in this region exhibits the most stable characteristics with respect to the change of resistance with time. The thin film in the above mentioned stable region shown in FIGS. 3 and 5 has 400 to 1000 [$\mu\Omega$cm] of specific resistivity as shown in FIG. 1. Referring to FIGS. 3 and 5, the thin film of Ta—Al—N composition in the stable region is more stable than that of Ta—Al composition and still more stable than that of Ta—N composition.

Referring to FIG. 2, the temperature coefficient of resistance of the thin film of Ta—Al—N composition is almost the same as that of Ta—N composition.

Further, referring to FIG. 4, the thin film of Ta—Al—N composition exhibit a plateau characteristic similar to the thin film of Ta—N composition, so that the formation of a Ta—Al—N film with a high degree of reproductivity similar to the Ta—N film is ensured.

Though the resistivity and the TCR contours for 300 - 500A thick Ta—Al—N film corresponding to 500 ohm/sq film are similar to the value for 1000 - 1500 A thick film, the resistance change of the thinner film in aging is larger than that of the thicker film in the region of no nitrogen (Ta—Al film) or no aluminum (Ta—N film), as shown in FIG. 5. Also in the fabrication process, it is desirable to hold all heat treatment temperatures to 250° C or less. In this regard, the very thin Ta—N and Ta—Al films need a higher stabilizing temperature, as high as 350° C or above, but the Ta-Al-N thin film is stable in ageing even at the heat treatment temperature of 200° C (FIG. 5).

The present invention, as illustrated in FIGS. 1 through 5, provides an advantageous thin film resistor having a specific resistivity within a range of from 400 to 1000$\mu\Omega$cm, a sheet resistance within a range of from 200 to 500 $\Omega$/sq, a TCR within a range of from 0 to $-300$ ppm/° C and a resistance change in ageing (after 1000 hours at 150° C) of less than 2000ppm. The production of such a thin film resistor is achieved by sputtering a Ta—Al composition target, wherein tantalum occupies 30 to 80% of the target surface, in an atmosphere containing nitrogen gas at a partial pressure in a range of from $2 \times 10^{-4}$ to $10 \times 10^{-4}$ Torr, so as to form a film having a thickness in the range of from 300 to 1500A.

When tantalum occupies less than 30% of the target surface, the resistance characteristic of the film resistor thereby produced approaches that of an Al—N composition thin film resistor and specific resistivity is increased, as is shown in FIG. 1, while TCR, and resistance change in ageing are also increased.

When tantalum occupies more than 80% of the target surface, the resistance characteristic of the produced thin film resistor approaches that of a thin film resistor consisting of $Ta_2N$, and thus, as shown in FIG. 1, the specific resistivity is reduced.

When an atmosphere containing nitrogen gas at a partial pressure greater than $10 \times 10^{-4}$ Torr is used, the temperature coefficient of resistance is increased in a negative direction, as is shown in FIG. 2, and resistance change in ageing is increased to a great extent, as is shown in FIG. 3.

When the film thickness is greater than 1500A, sheet resistance is reduced to such an extent that the resistor formed is impractical to use.

Therefore, according to the present invention, the abovementioned conditions with regard to the target composition, the atmosphere and the film thickness, are taught to be carefully selected.

The thin film of Ta—Al—N composition according to the present invention has advantageous features as described above; particularly in that the stability of resistance is mantained even if the thickness of the film is reduced and the specific resistivity of the film in the stable region shown in FIG. 3 is about four times higher than that of Ta—N composition. Therefore, according to the present invention, a thin film resistor of a Ta—Al—N composition is described having a sheet resistance with a value ten times that of the conventional thin film of Ta—N composition and two to three times that of the Ta—Al composition.

What we claim is:

1. A thin film resistor of essentially Ta—Al—N composition having a specific resistivity in the range of from 400 to 1000$\mu\Omega$cm, a temperature coefficient of resistivity in the range of from 0 to $-300$ ppm/° C, and a characteristic of resistivity change in ageing of less than 2000 ppm, wherein said thin film resistor is produced by a process comprising the steps of:

providing an atmosphere consisting essentially of nitrogen at a partial pressure in the range from $2 \times 20^{-4}$ to $10 \times 10^{-4}$ Torr. and an inert gas;

placing a substrate within said atmosphere;

providing a target having a composition consisting essentially of tantalum and aluminum, said target composition including said tantalum covering the surfaces of said target within the range of from 30 to 80%, and;

performing a sputtering process on said target within said atmosphere to form said thin film resistor having a thickness in the range from 300 to 1500A under conditions which cause said formed thin film resistor to have said specific resistivity and said temperature coefficient or resistivity within said corresponding ranges; and heat treating said formed thin film resistor at a temperature of not more than 250° C to cause said thin film resistor to have said characteristic of resistivity change in ageing within said range.

2. A method of producing a thin film resistor, with a high degree of reproductivity, of essentially Ta—Al—N composition having a specific resistivity in a range of from 400 to 1000$\mu\Omega$cm, a specific temperature coefficient of resistance in a range of from 0° to $-300$ ppm/° C, comprising the steps of:

providing an atmosphere consisting essentially of an inert gas, and nitrogen, wherein said nitrogen is at a partial pressure in the range from $2 \times 10^{-4}$ to $10 \times 10^{-4}$ Torr;

placing a substrate within said atmosphere;

providing a target having a composition consisting essentially of tantalum and aluminum, said target composition including said tantalum covering the surface of said target within the range of from 30 to 80%;

performing a sputtering process on said target within said atmosphere to form said thin film resistor having a thickness in the range of from 300 to 1500A under the sputtering condition so that said thin film resistor exhibits a plateau characteristic in a plot of said temperature coefficient of resistance versus nitrogen partial pressure in said nitrogen partial pressure range; and heat treating said formed thin film resistor at a temperature of not more than 250° C to provide said thin film resistor with a stabilized specific resistance change in ageing characteristic of less than 2000 ppm.

3. A method of producing a thin film resistor, of essentially Ta—Al—N composition having a specific resistivity in a range of from 400 to 1000μΩcm, a specific temperature coefficient of resistance in a range of from 0 to −300ppm/° C, comprising the steps of:

providing an atmosphere consisting essentially of an inert gas and nitrogen wherein said nitrogen is at a partial pressure in the range of from $2 \times 10^{-4}$ to $10 \times 10^{-4}$ Torr.;

placing a substrate within said atmosphere;

providing a target having a composition consisting essentially of tantalum and aluminum, said target composition including said tantalum covering the surface of said target within the range of from 30 to 80%;

performing a sputtering process on said target within said atmosphere to form said thin film resistor having a thickness in the range of from 300 to 1500A under sputtering conditions which cause said formed thin film resistor to have said specific resistivity and said specific temperature coefficient of resistance in said corresponding ranges; and heat treating said formed thin film resistor at a temperature of not more than 250° C to provide said thin film resistor with a stabilized specific resistance change in ageing characteristic of less than 2000ppm.

* * * * *

UNITED STATES PATENT OFFICE
CERTIFICATE OF CORRECTION

Patent No. 4,042,479  Dated August 16, 1977

Inventor(s) Jun'ichiro Yamazaki et al

It is certified that error appears in the above-identified patent and that said Letters Patent are hereby corrected as shown below:

Column 1, line 43, "words, a" should be -- A --;
          line 49, "i" should be -- is --.

Column 2, lines 15-18, should not be indented;
          line 31, insert -- DETAILED -- before "Description";
          line 42, "0.55" should be -- 0.53 --.

Column 3, line 27, "exhibit" should be -- exhibits --.

Column 4, line 37, claim 1, "20" should be -- 10 --;
          line 59, claim 2, "0°" should be -- 0 --.

Signed and Sealed this

Fifteenth Day of November 1977

[SEAL]

Attest:

RUTH C. MASON
*Attesting Officer*

LUTRELLE F. PARKER
*Acting Commissioner of Patents and Trademarks*